US010407136B1

(12) United States Patent
Bak et al.

(10) Patent No.: US 10,407,136 B1
(45) Date of Patent: Sep. 10, 2019

(54) AUTONOMOUS WATERCRAFT WITH A WATERPROOF CONTAINER SYSTEM THAT HOUSES SATELLITE COMMUNICATION TERMINAL

(71) Applicant: The Boeing Company, Chicago, IL (US)

(72) Inventors: Anthony Sangsoo Bak, Stone Ridge, VA (US); Thomas John Berens, Alexandria, VA (US); Ernest L. Ferrier, Jr., Livermore, CA (US); Carlos M. Montes, Marysville, WA (US); Timothy J. Ong, San Jose, CA (US); Cameron Alexander Sanders, Washington, DC (US); Terry Allan Smith, Sunnyvale, CA (US); Jeffrey Scott Willcox, Arlington, MA (US); Youstina Yacoub, Centreville, VA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 16/006,081

(22) Filed: Jun. 12, 2018

(51) Int. Cl.
B63B 25/00 (2006.01)
H05K 7/20 (2006.01)
H05K 5/00 (2006.01)
H04B 1/38 (2015.01)
H05K 5/02 (2006.01)

(52) U.S. Cl.
CPC ............. B63B 25/004 (2013.01); H04B 1/38 (2013.01); H05K 5/0004 (2013.01);
(Continued)

(58) Field of Classification Search
CPC ............. B63B 25/004; B63B 2203/00; H05K 5/0247; H05K 7/20409; H04B 1/38; H04B 2001/3894
(Continued)

(56) References Cited

U.S. PATENT DOCUMENTS 5,850,803 A * 12/1998 Jones ..................... B63B 35/731
114/343
2004/0015277 A1* 1/2004 Cardoza .................. B63B 22/18
701/21
2015/0060635 A1* 3/2015 Schlintz ................. B63H 20/02
248/640

OTHER PUBLICATIONS

Liquid Robotics, "The Wave Glider; Transform How You Understand the Ocean", Data sheet, Jan. 1, 2017, pp. 1-4, obtained on Jun. 18, 2018, obtained from internet: https://www.boeing.com/resources/boeingdotcom/defense/autonomous-systems/wave-glider-sharc/wave_glider_data_sheet.pdf.

(Continued)

Primary Examiner — Ayodeji O Ayotunde
(74) Attorney, Agent, or Firm — Coats & Bennett, PLLC

(57) ABSTRACT

An autonomous watercraft with a waterproof container that houses a satellite communication terminal. The waterproof container includes a first shell mounted on a deck of the watercraft and that has a sealed first interior space that contains satellite communication circuitry of the terminal. The waterproof container also includes a second shell mounted under the deck of the watercraft and that has a sealed second interior space that contains the processing circuitry of the terminal. The first and second shells include ports configured to receive connectors for communication signaling and/or power. The first shell can also include a pressure port to pressurize the first interior space for use in leak detection. The shells can also include heat sinks to cool the satellite communication terminal.

20 Claims, 14 Drawing Sheets

(52) U.S. Cl.
CPC ....... *H05K 5/0247* (2013.01); *H05K 7/20409* (2013.01); *B63B 2203/00* (2013.01); *H04B 2001/3894* (2013.01)

(58) Field of Classification Search
USPC .................................................... 455/575.1
See application file for complete search history.

(56) References Cited

OTHER PUBLICATIONS

Liquid Robotics, "The Wave Glider; SV3 v200 Platform Specifications", Rev. 1.9, Jan. 1, 2017, pp. 1-2, retrieved on Jun. 12, 2018, retrieved from Internet: swanpro.com/Docs/Brochure/LRI/Iri-specs-sv3-1.1.pdf.

Inmarstat, "Broadband terminals A quick reference guide", Feb. 1, 2015, pp. 1-2, Inmarsat Global Limited, retrieved on Jun. 12, 2018, retrieved from internet: https://www.inmarsalcom/wp.../10/Inmarsat_Broadband_Terminal_Comparison.pdf.

Global Marine Networks, "FleetBroadband", Product categories, retrieved on Jun. 12, 2018, pp. 1-5, retrieved from Internet: http://www.globalmarinenet.com/product-category/satellite-phones/inmarsat-satellite-phones/fleetbroadband/.

Global Marine Networks, "Fleet One", Product categories, retrieved on Jun. 12, 2018, pp. 1-4, retrieved from internet: http://www.globalmarinenet.com/product-category/satellite-phones/inmarsat-satellite-phones/fleet-one/.

* cited by examiner

AUTONOMOUS WATERCRAFT WITH A WATERPROOF CONTAINER SYSTEM THAT HOUSES SATELLITE COMMUNICATION TERMINAL

TECHNOLOGICAL FIELD

The present disclosure relates generally to autonomous watercraft with a waterproof container system, and more specifically, with an autonomous watercraft with a waterproof container system that seals separate circuitry of a satellite communication terminal.

BACKGROUND

There are many applications for electrical circuitry that is used in harsh environments. These can include maritime environments for use on a wide variety of vessels. In these environments, the electrical circuitry can be exposed to saltwater, freshwater, sun, and wind. The electrical circuitry can be submerged either temporarily such as when mounted to the deck of a vessel that is swamped with waves, or more permanently such as when mounted to a section of the watercraft that remains underwater.

Containers can be used to house the electrical circuitry and provide for some protection. However, these containers are often not effective in preventing the ingress of water. Often times the containers can provide protection for a limited time, but cannot prevent the ingress of water for an extended period. For example, the containers can protect the electrical circuitry from splashing water such as that caused by waves or rain, but are not able to provide protection when the electrical circuitry is submerged for an extended period of time.

Containers are also are unable to provide waterproof protection for circuitry that has an irregular shape. The irregular shapes can be a result of the requirements of the electrical circuitry itself, such as the irregular shapes of antennas. The containers are not configured to accommodate the irregular shapes and still provide the needed amount of waterproofing protection.

SUMMARY

One aspect is directed to a watercraft that includes first and second circuitry. A first shell is mounted on a deck of the watercraft with the first shell including a sealed first interior space that contains the first circuitry. A second shell is mounted under the deck of the watercraft with the first shell including a sealed second interior space sized to contain the second circuitry. First ports extend through each of the first and second shells. A pressure port extends through the first shell and is in communication with the first interior space with the pressure port including an inlet and a seal that extends across the inlet to prevent ingress of water into the first interior space and egress of gas out of the first interior space. A first heat sink is positioned in the first interior space to contact against the first circuitry. A second heat sink is positioned in the second interior space to contact against the second circuitry.

In one aspect, the first circuitry is satellite communication circuitry and the second circuitry is processing circuitry.

In one aspect, each of the first and second shells includes a waterproof rating of IP-68 to protect the first circuitry and the second circuitry.

In one aspect, the pressure port is positioned away from the first ports on the first shell.

In one aspect, each of the first and second shells include a base and a lid configured to be sealed together to form the sealed first and second interior spaces with the base of the first shell mounted on the deck of the watercraft and the base of the second shell mounted in an interior space of the watercraft.

In one aspect, communication and power cables connect to the first ports of the first and second shells to integrate the first circuitry and the second circuitry.

In one aspect, one of the heat sinks extends across a first opening in the second shell and is exposed on the exterior of the second shell.

In one aspect, a second opening in the first shell is positioned away from the deck of the watercraft with the second opening sized to receive a radome of the satellite communication circuitry that extends outward away from the deck of the watercraft.

In one aspect, a pressure sensor is positioned within the first interior space to detect a pressure within the first interior space.

In one aspect, a router is positioned within the second interior space.

One aspect is directed to a watercraft. The watercraft includes first circuitry positioned on the watercraft. Second circuitry is positioned on the watercraft away from the first circuitry and in communication with the first circuitry. A waterproof first shell is mounted to the watercraft and contains the first circuitry. The first shell includes: a first base and a first lid configured to be connected together to form a sealed first interior space sized to contain the first circuitry; first ports that extend through the first shell and are in communication with the first interior space; a pressure port mounted away from the first ports with the pressure port extends through the first shell and in communication with the first interior space and including a seal that extends across the pressure port to prevent ingress of water into the interior space and egress of pressurized gas out of the first interior space; a first heat sink connected to the first shell and positioned in the first interior space against the first circuitry. A waterproof second shell is mounted to the watercraft away from the first shell and contains the second circuitry. The second shell includes: a second base and a second lid configured to be connected together to form a sealed second interior space sized to contain the second circuitry; second ports that extend through the second shell and are in communication with the second interior space; and a second heat sink positioned in the second interior space to contact against the second circuitry.

In one aspect, each of the first and second shells has a waterproof rating of IP-68 to protect the first circuitry and the second circuitry.

In one aspect, RF cables extend between first pairs of the first and second ports on the first and second shells to communicatively connect the first circuitry and the second circuitry, and a type G expansion cable extends between second pairs of first and second ports on the first and second shells.

In one aspect, the second shell includes an opening with the heat sink extending across the opening and being exposed on the exterior of the second shell.

In one aspect, the heat sink is connected to the second shell and sealed against the second shell to prevent ingress of water through the opening and into the second interior space.

In one aspect, the first lid includes an opening in communication with the first interior space with the opening configured to receive a radome of a satellite communication circuitry.

In one aspect, a pressure sensor is positioned within the first interior space to detect a pressure of the gas in the first interior space.

In one aspect, a router is positioned within the second interior space.

One aspect is directed to a waterproof container system configured to protect first circuitry and second circuitry. The waterproof container system includes a waterproof first shell that contains the first circuitry with the first shell including: a first base and a first lid configured to be connected together to form a sealed first interior space sized to contain the first circuitry; first ports that extend through the first shell and are in communication with the first interior space; a pressure port mounted away from the first ports with the pressure port extending through the first shell and in communication with the first interior space and including a seal that extends across the pressure port to prevent ingress of water into the interior space and egress of pressurized gas out of the first interior space; and a first heat sink connected to the first shell and positioned in the first interior space to contact against the first circuitry. A waterproof second shell is separate from the first shell and contains the second circuitry. The second shell includes: a second base and a second lid configured to be connected together to form a sealed second interior space sized to contain the second circuitry; second ports that extend through the second shell and are in communication with the second interior space; and a second heat sink positioned in the second interior space to contact against the second circuitry.

In one aspect, the first shell is sized to contain the first circuitry that is satellite communication circuitry and the second shell is sized to contain the second circuitry is processing circuitry.

In one aspect, each of the first and second shells has a waterproof rating of IP-68 to protect the first circuitry and the second circuitry.

The features, functions and advantages that have been discussed can be achieved independently in various aspects or may be combined in yet other aspects, further details of which can be seen with reference to the following description and the drawings.

DETAILED DESCRIPTION

The present disclosure is directed to an autonomous watercraft with a waterproof container that houses a satellite communication terminal. The waterproof container includes a first shell mounted on a deck of the watercraft and that has a sealed first interior space that contains the satellite communication circuitry of the terminal. The waterproof container also includes a second shell mounted under the deck of the watercraft and that has a sealed second interior space that contains the processing circuitry of the terminal. The first and second shells include ports configured to receive connectors for communication signaling and/or power. The first shell can also include a pressure port to pressurize the first interior space and a pressure sensor for use with leak detection. The shells can also include heat sinks to cool the satellite communication terminal.

Figure 1:
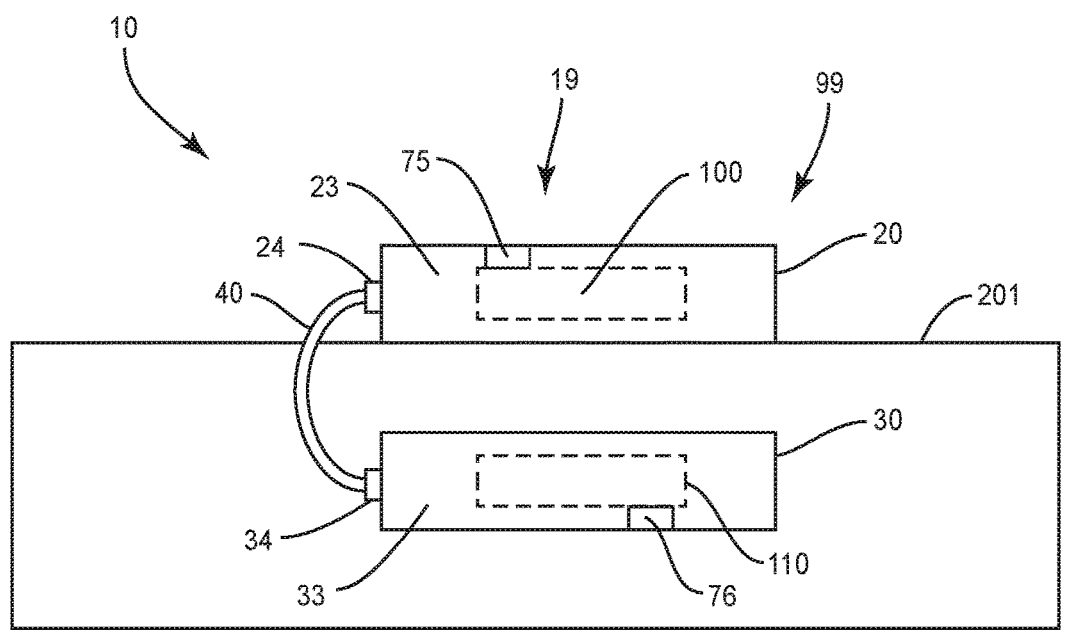
FIG. 1 is a schematic diagram of an autonomous vehicle with a waterproof container system protecting a satellite terminal.

FIG. 1 schematically illustrates an autonomous watercraft 10 that includes a waterproof container system 19 that houses a first and second circuitry 100, 110. One application includes the waterproof container system 19 housing a satellite terminal 99 that includes satellite communication circuitry 100 that is connected to processing circuitry 110. The waterproof container system 19 includes a first shell 20 and a second shell 30. The first shell 20 includes a waterproof first interior space 23 that contains and protects the satellite communication circuitry 100. Likewise, a second shell 30 includes a waterproof interior space 33 that contains and protects the processing circuitry 110. The first and second shells 20, 30 are separate and independent to be spaced away from each other.

A heat sink 75 with the first shell 20 can be used to control a temperature of the first circuitry 100. A heat sink 76 with the second shell 30 can be used to control a temperature of the second circuitry 110.

Figure 2:
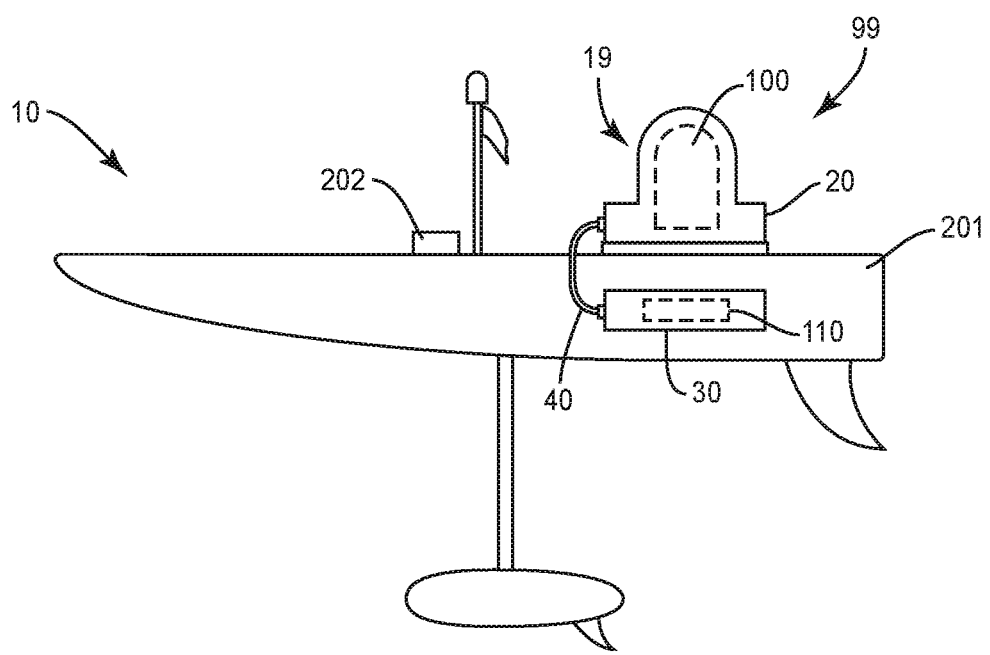
FIG. 2 is a schematic diagram of an autonomous vehicle with a waterproof container system protecting a satellite terminal.

The autonomous watercraft 10 with the waterproof container system 19 is applicable for use in a wide variety of environments in which part or an entirety of the satellite terminal 99 can be submersed in water. FIG. 2 illustrates one application of an autonomous watercraft 10 that specifically includes use on a Wave Glider watercraft from Liquid Robotics, a Boeing Company, headquartered in Sunnyvale, Calif., USA. The watercraft 10 includes a platform 201 for mounting the satellite terminal 99. The first shell 20 is mounted to a deck of the platform 201 with the satellite communication circuitry 100 positioned above the deck of the watercraft 10. The second shell 30 is mounted below the deck of the watercraft 10. FIG. 2 includes the second shell 30 mounted in a compartment within the interior of the platform 201. Another application with the second shell 30 below the deck of the watercraft 10 includes mounted to a bottom of the platform 201 (not illustrated). The second shell 30 is configured to remain waterproof when submersed in water, particularly during rough weather. The one or more connectors 40 connect the first and second shells 20, 30. The waterproof container system 19 can be used to house a wide variety of devices. One specific device includes Wideband Streaming L-band (WiSL) satellite communication terminal available from Inmarsat.

The waterproof container system 19 includes the first shell 20 and the second shell 30. Each of the first and second shells 20, 30 is shaped and configured to conform to and accommodate the sections of the satellite communication circuitry that they protect. The first shell 20 can include a base 21 as illustrated in FIG. 3 and a lid 22 as illustrated in FIG. 4.

Figure 3:
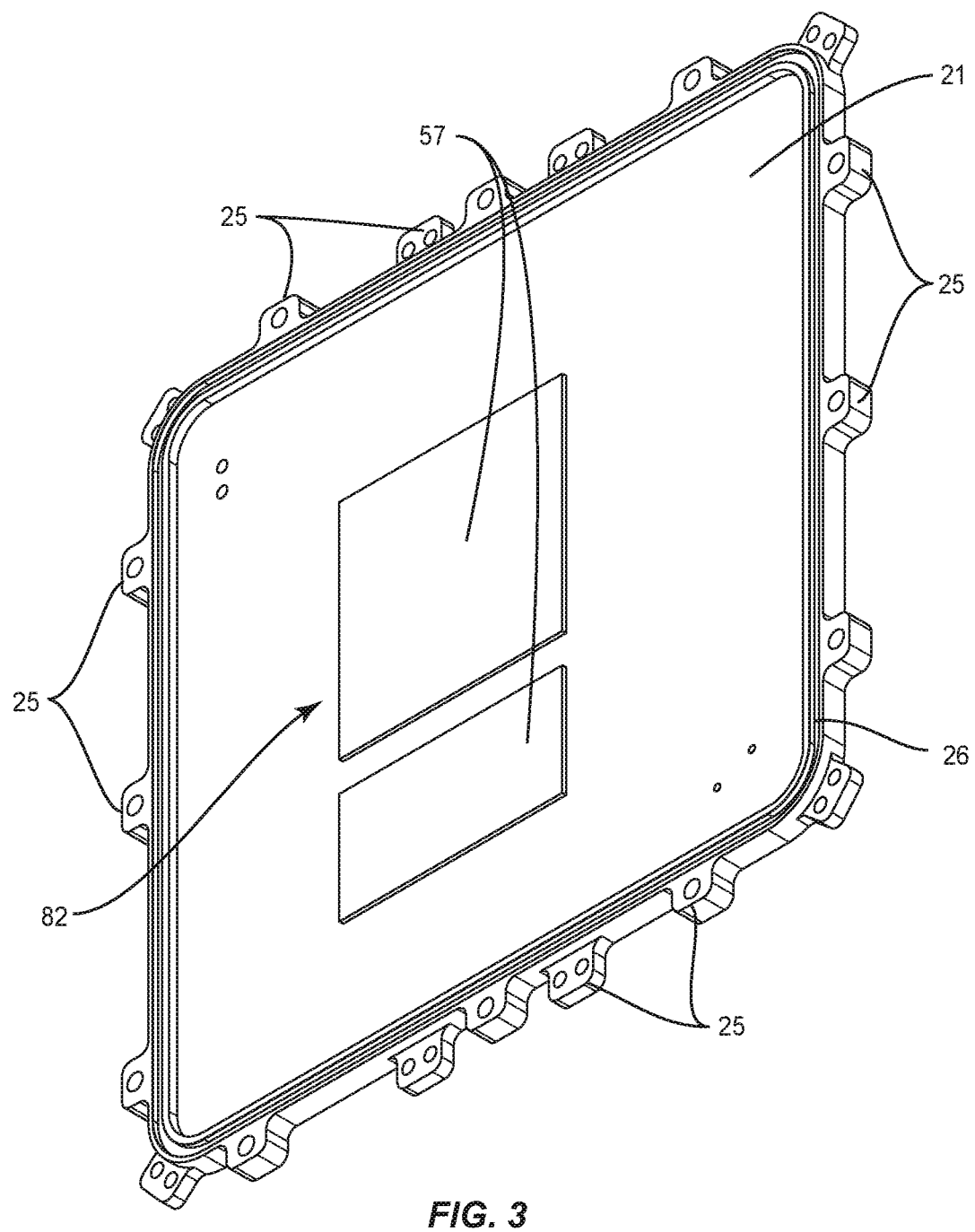
FIG. 3 is a perspective view of a base of a first shell.

The base 21 is substantially flat and can include various shapes, including rectangular as illustrated in FIG. 3. Extensions 25 extend radially outward from the outer perimeter and include openings configured to receive fasteners to secure the base 21 to the lid 22. The extensions 25 can also receive fasteners to connect the base 21 to the platform 201 of the watercraft 10. A seal 26, such as an o-ring, extends around the outer perimeter inside of the extensions 25 to prevent water from invading into the interior space 23. The base 21 can include a groove around the outer perimeter to receive the seal 26. The base 21 can include a heat sink 82 that includes one or more heat sink pads 57 to remove heat from the satellite communication circuitry 100. The heat sink pads 57 can be relatively thin flat members and can be constructed from various metals, including but not limited to aluminum alloy and copper. The heat sink pads 57 can be secured to the base 21 via one or more of fasteners and adhesives.

The lid 22 includes side walls 27 that extend outward from a top 28. The side walls 27 are continuous around the perimeter and include an edge 29 opposite from the top 28 that engages with the lid 22. The edge 29 can include a groove to receive the seal 26 which is secured between the edge 29 and the base 21. Extensions 50 extend radially outward from the side walls 27 at the edges 29. The extensions 50 include openings and are positioned to align with the extensions 25 on the base 21. Fasteners can extend through the aligned openings be secured to apply a force that secures the lid 22 to the base 21 and prevent the ingress of water.

Figure 4:
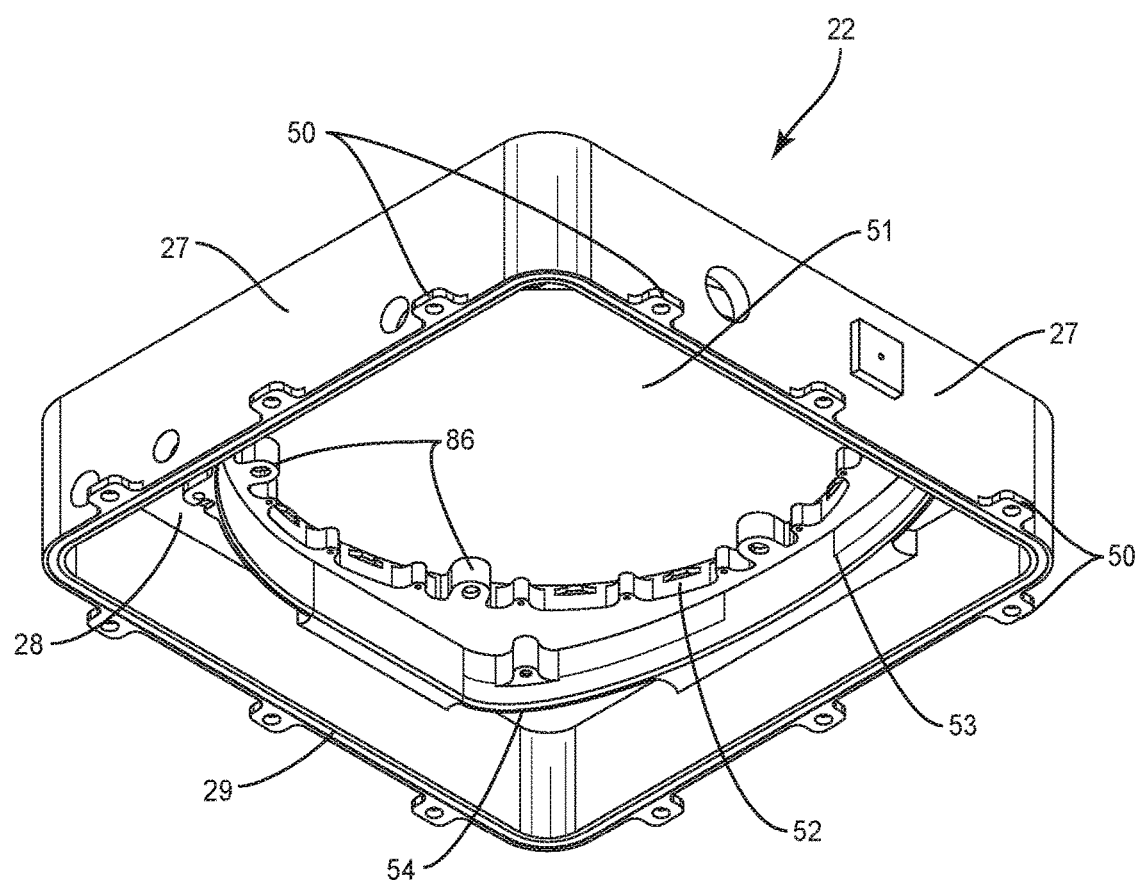
FIG. 4 is a perspective view of a lid of a first shell.
Figure 5:
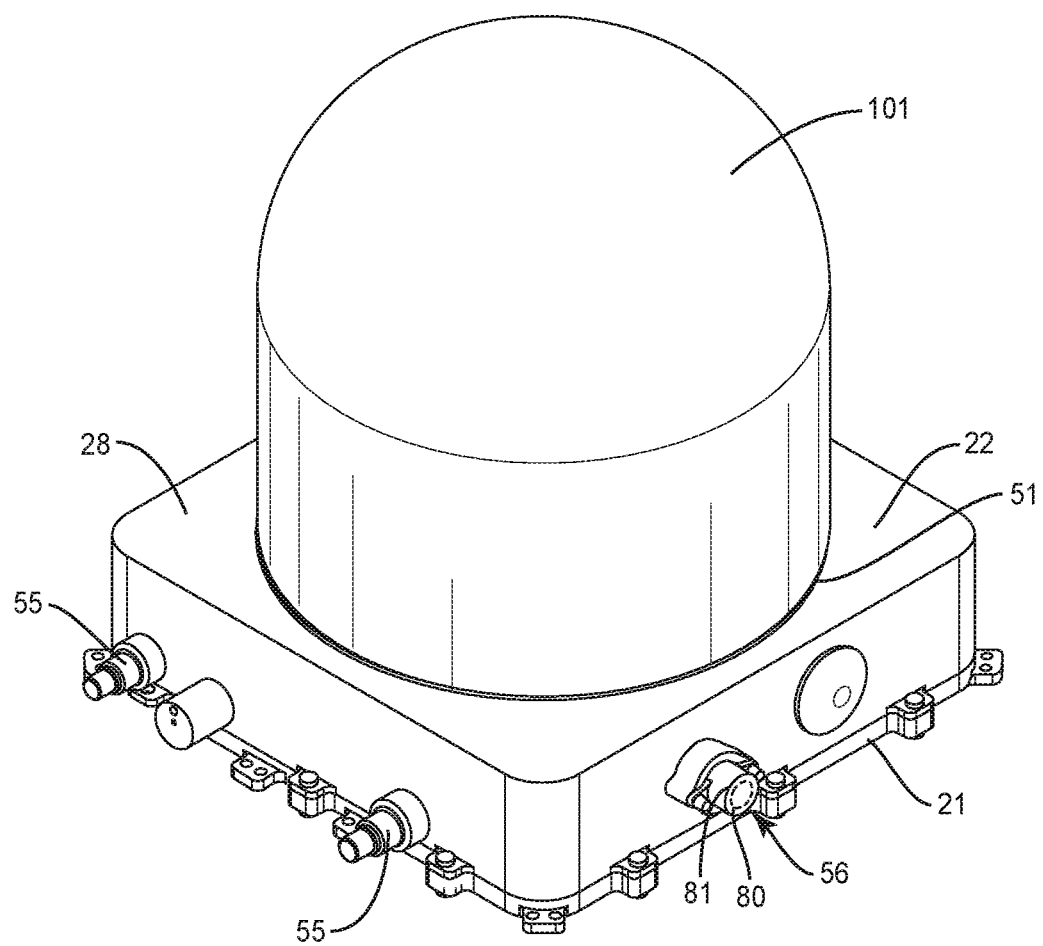
FIG. 5 is a perspective view of a radome associated with satellite communication circuitry extending outward from a first shell.

As illustrated in FIGS. 4 and 5, the top 28 includes an opening 51 to accommodate and extend around a radome 101 associated with the satellite communication circuitry 100. An inner edge 52 of the opening 51 is sized and shaped to match the radome 101 and can include extensions 86 to receive fasteners to attach to the radome 101. As illustrated in FIG. 4, interior walls 53 can extend inward from the top 28 between the opening 51 and the side walls 27. The interior walls 53 can provide additional strength to the top 28. The bottom edge 54 of the interior walls 53 can be configured to position a seal to prevent water from the radome 101 from reaching the satellite communication circuitry 100.

As illustrated in FIG. 5, ports 55 can extend through the side walls 27. The ports 55 provide for power and/or communication connections with the processing circuitry 110 or with other external devices (e.g., control unit 202, batteries) on the watercraft 10. The ports 55 can be configured for cable connections and include male pins/and or female holes for connection with a connector 40, such as a cable. The ports 55 can also be configured for RF communications.

A pressure port 56 also extends through the side walls 27 and forms a conduit to pressurize the interior space 23 after the base 21 and lid 22 have been secured together. The pressure port 56 includes an opening 80 in communication with the interior space 23. A seal 81 extends across the opening 80 and provides for insertion of a pressurized gas into the interior space 23. The seal 81 also prevents the outward escape of the pressurized gas.

Figure 6:
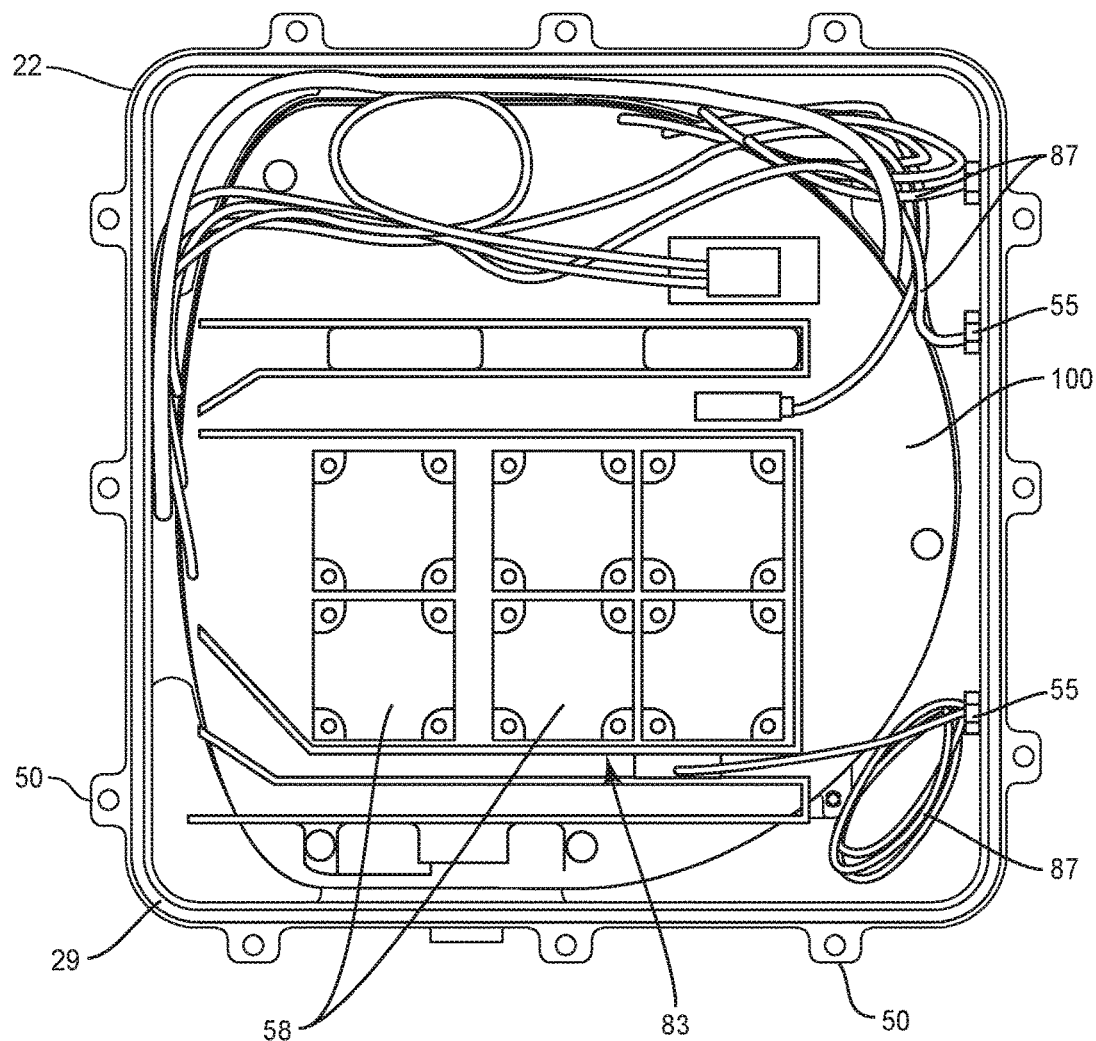
FIG. 6 is a bottom view of satellite communication circuitry positioned in a lid of a first shell.
Figure 7:
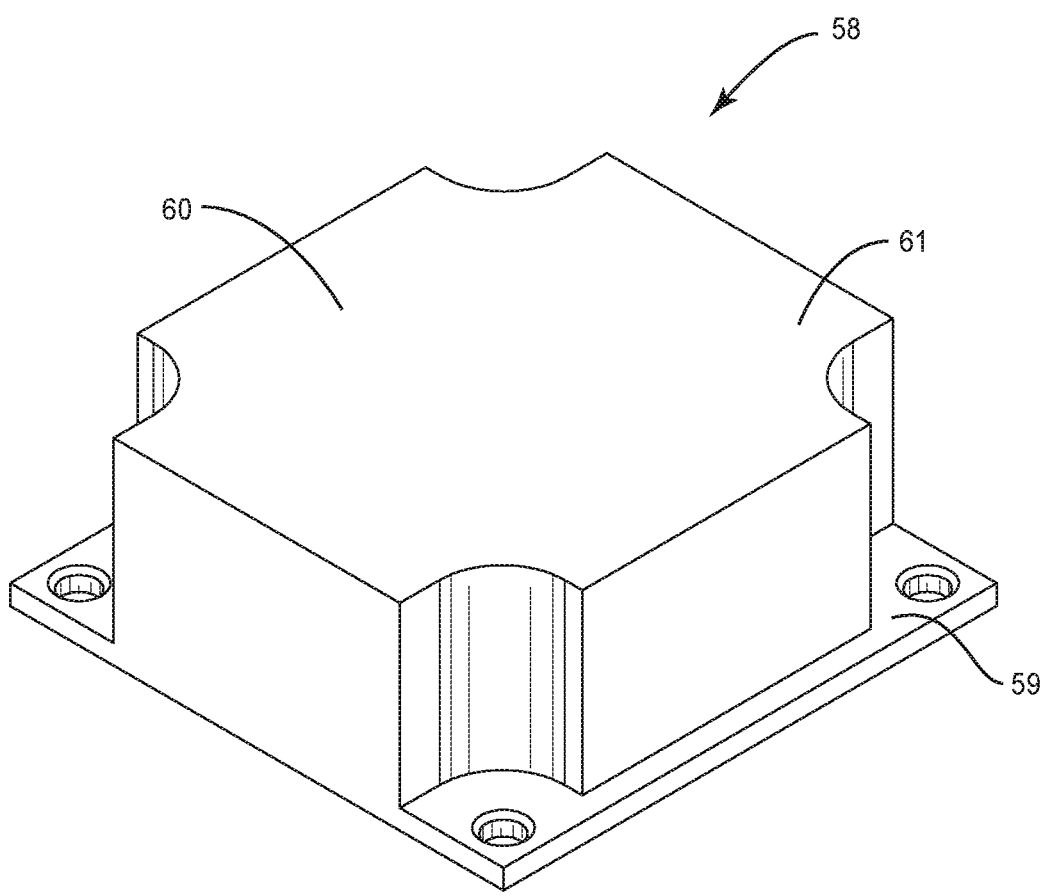
FIG. 7 is a perspective view of a heat sink module of a first shell.

FIG. 6 illustrates the satellite communication circuitry 100 positioned in the lid 22 (the base 21 is not attached to the lid 22 in FIG. 6). A heat sink 83 constructed from modular heat sink sections 58 are mounted to the underside of the satellite communication circuitry 100 and are positioned to align with and contact against the heat sink 57 on the base 21 (see FIG. 3). As illustrated in FIG. 7, the modular heat sink sections 58 include a foot 59 that connects to the satellite communication circuitry 100. Openings extend through the foot 59 to receive fasteners for the connection. The modular heat sinks sections 58 also include a block 60 that extends outward from the foot 59 and includes a top 61 that contacts against the heat sink 57 on the base 21. The heat sink 57 can be constructed from various metals, including but not limited to aluminum and copper.

Figure 8:
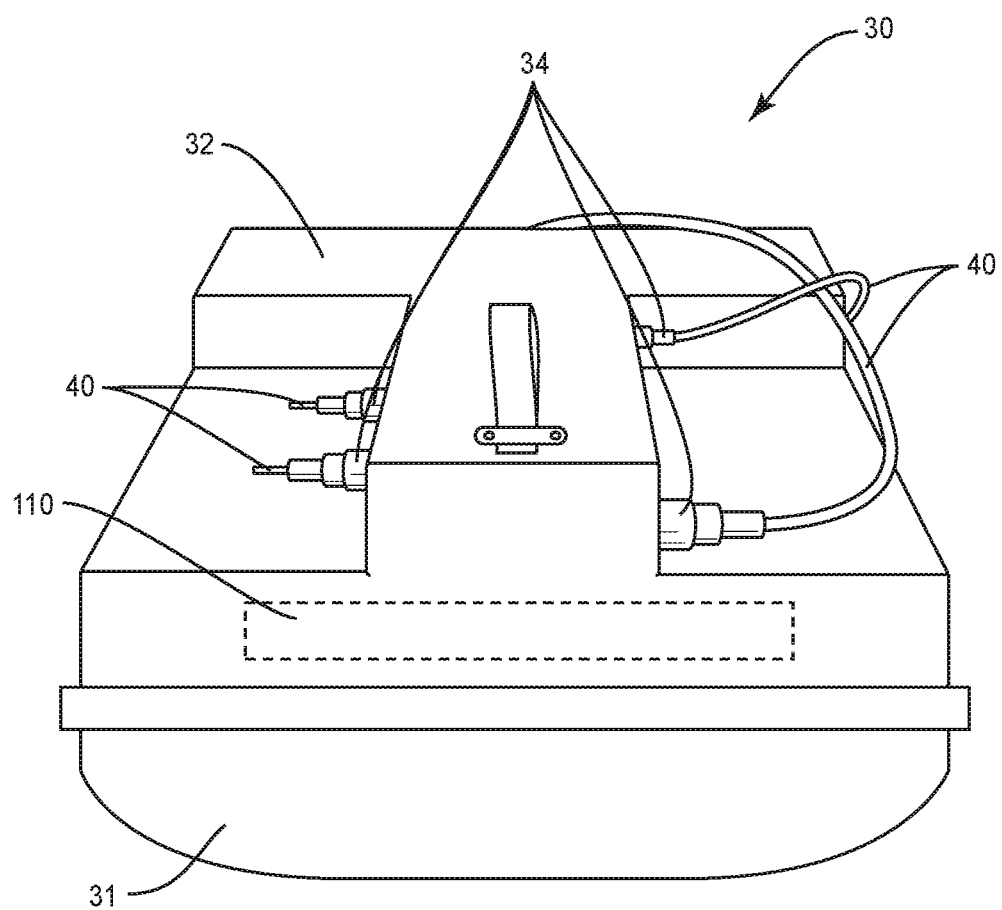
FIG. 8 is a perspective view of a second shell and connectors.

FIG. 8 illustrates the second shell 30 extending around and providing a waterproof container for the processing circuitry 110. The second shell 30 includes a base 31 and lid 32 configured to be sealed together to form the waterproof interior space 33. Ports 34 extend through the second shell 30 and are in communication with the interior space 33. The ports 34 can be configured for cable connections and include male pins/and or female holes for connection with a connector 40, such as a cable. The ports 34 can also be configured for RF communications.

Figure 9:
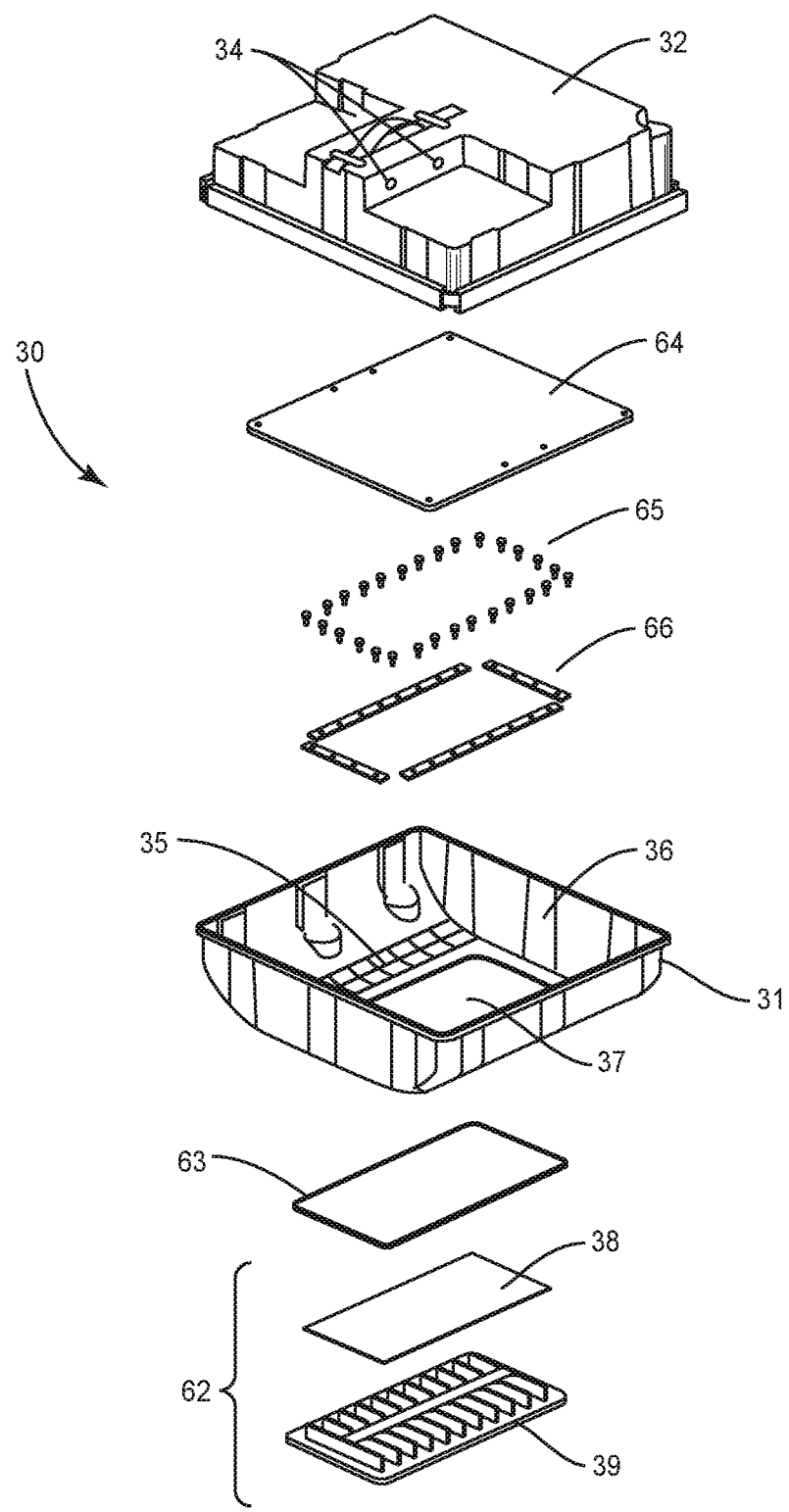
FIG. 9 is an exploded perspective view of a second shell.

FIG. 9 illustrates an exploded view of the second shell 30. The base 31 includes a bottom 35 with sidewalls 36 extending outward from one side. An opening 37 extends through the bottom 35 and is shaped and sized to receive a heat sink 62. The heat sink 62 includes one or more of a heat exchange pad 38 and a heat exchange plate 39. The heat exchange pad 38 is substantially flat and sized to extend across and cover the opening 37. The heat exchange pad 38 can be connected to the bottom 35 in various manners, including but not limited to mechanical fasteners and adhesives. A seal 63, such as an o-ring, can be positioned between the heat exchange pad 38 and the bottom 35 to prevent the ingress of water. The heat exchange plate 39 contacts against an outer side of the heat exchange pad 38. The heat exchange plate 39 includes a base 70 and fins 71. The base 70 can include a flat side that is opposite from the fins 71. The fins 71 extend from the base 70 and are spaced apart to provide surface area to dissipate the heat from the processing circuitry 110. The second shell 30 can be positioned on the watercraft 10 for the base 70 to be exposed to expel the heat into the environment. Specific applications include the base 70 in contact with the platform 201 of the watercraft 10, and exposed to contact the surrounding water. The heat sink 62 can be constructed from various materials, including but not limited to aluminum and copper.

Returning to FIG. 9, the second shell 30 also includes a mounting plate 64 connected to an inner side of the base 31. The mounting plate 64 provides a platform for mounting the processing circuitry 110 within the interior space 33. The mounting plate 64 can be constructed from a rigid material, such as metal, to provide a secure platform. In a specific embodiment, the mounting plate 64 is a one-quarter inch (¼") sheet of aluminum. The mounting plate 64 can be connected to the base 31 with mechanical fasteners 65. Further, a seal 66, such as an o-ring, can be positioned between the mounting plate 64 and the bottom 35 of the base 31 to prevent the ingress of water.

The lid 32 is sized to connect to the base 31 and form the enclosed interior space 33. The lid 32 can include various shapes to accommodate the processing circuitry 110. A seal (not illustrated) can be positioned between the lid 32 and base 31 to prevent water ingress. The ports 34 extend through the lid 32 for the various connections to the processing circuitry 110.

Figure 10:
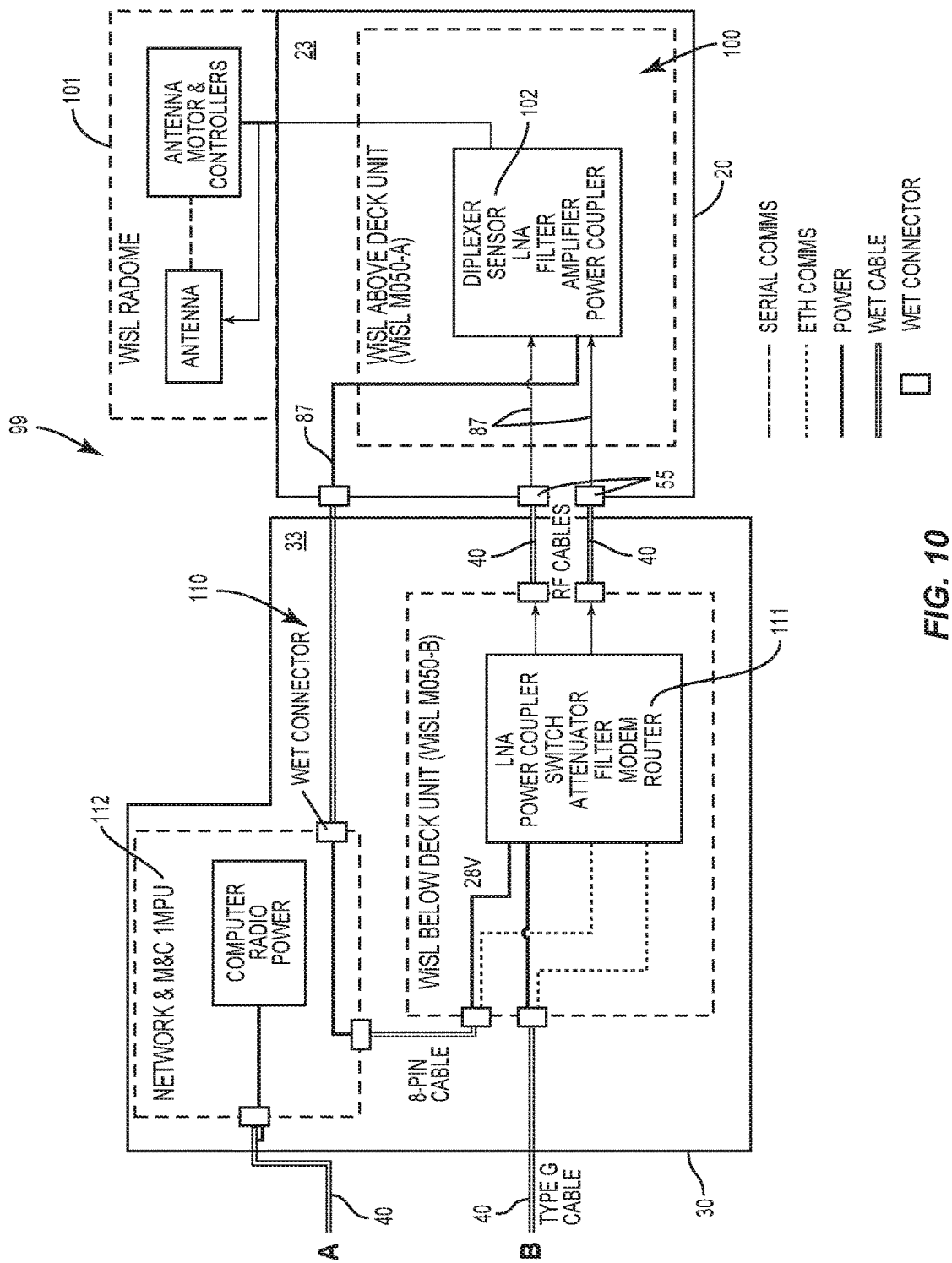
FIG. 10 is a schematic diagram of satellite communication circuitry positioned in a first shell and processing circuitry positioned in a second shell.

FIG. 10 depicts the satellite terminal 99 that includes the satellite communication circuitry 100 and the processing circuitry 110. The satellite communication circuitry 100 includes circuitry configured to transmit and receive wireless communication signals, such as to and from one or more satellites. The satellite communication circuitry 100 includes at least the "front end" components configured for wireless communication, such as a diplexer, low noise amplifier (LNA), filters, amplifiers, and the like, as known in the art. One example is a WiSL M050-A available from Inmarsat.

The satellite communication circuitry 100 is disposed in the first shell 20, which includes ambient condition monitors, such as for monitoring pressure, temperature, and the like. For example, a pressure sensor 102 monitors the air pressure within the interior space 23 within the first shell 20, which can be maintained in excess of atmospheric pressure to ensure that it is hermetically sealed against water intrusion. The first shell 20 allows the satellite communication circuitry 100 to be located on the deck of the watercraft 10, where it is subject to transient submersion, such as by ocean wave over-wash. The first shell 20 includes the heat sink 82 operative to transfer heat generated by the satellite communication circuitry 100 to the ambient air. Cabling 87 (see also FIG. 6) extends between the components of the satellite communication circuitry 100 and the ports 55. The cabling 87 provides for communication and power to be supplied to the various components in addition to the one or more pressure sensors 102.

An antenna, and associated equipment and electronics such as motors and controllers, are disposed in a radome 101, which may be mounted to, or formed integrally with, the first shell 20. Electrical conductors extend between the satellite communication circuitry 100 and the antenna and equipment in the radome 101, carrying antenna transmit (Tx) and receive (Rx) signals, power, motor command signals, and the like. In the case that the radome 101 is not integrally formed with the first shell 20, the electrical conductors and their associated connectors are marine rated and do not impair the hermetic integrity of the first shell 20.

The processing circuitry 110 includes communication processing circuitry not part of the satellite communication circuitry 100, such as a modem (modulator/demodulator), baseband processor, digital filters, and the like. One example is a WiSL M050-B available from Inmarsat. Those of skill in the art will readily recognize that the division between front end circuits in the satellite communication circuitry 100 and signal processing and baseband processing in the processing circuitry 110 can differ in different applications. For example, in one aspect, the satellite communication circuitry 100 can include primarily analog signal processing circuitry, which is located physically close to the radome 101 to minimize signal attenuation between and antenna and the front end satellite communication circuitry 100. In this aspect, signals downstream of the LNA and filters are digitized, and then transferred to the processing circuitry 110. However, in other aspects the physical division of circuitry between satellite communication circuitry 100 and processing circuitry 110 may not coincide with the analog/digital domain conversion.

According to an aspect of the present disclosure, a router 111 is integrated with the processing circuitry 110, providing remote control capability. The router 111 enables communication between the wireless communication terminal of processing circuitry 110 and other circuits and devices on the watercraft 10. One example is Model No. 807 available from Cisco Systems.

The processing circuitry 110 disposed within the interior space 33 of the second shell 30 can also include a Micro Computer Unit (MCU) 112, which includes computational circuitry, a high voltage power supply, and the like.

Figure 11:
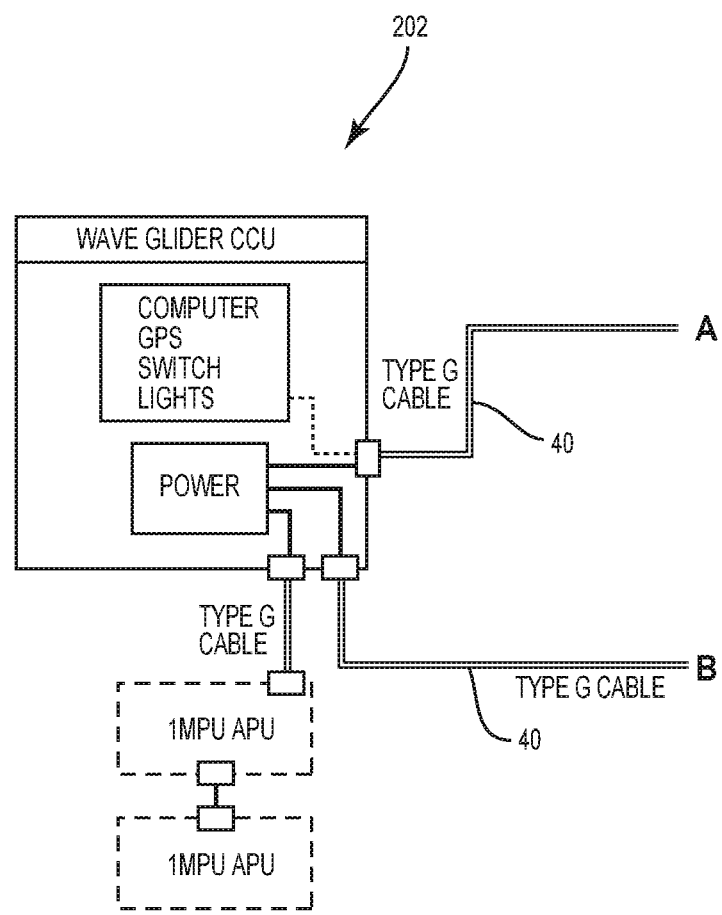
FIG. 11 is a schematic diagram of a control unit of a watercraft.
Figure 12:
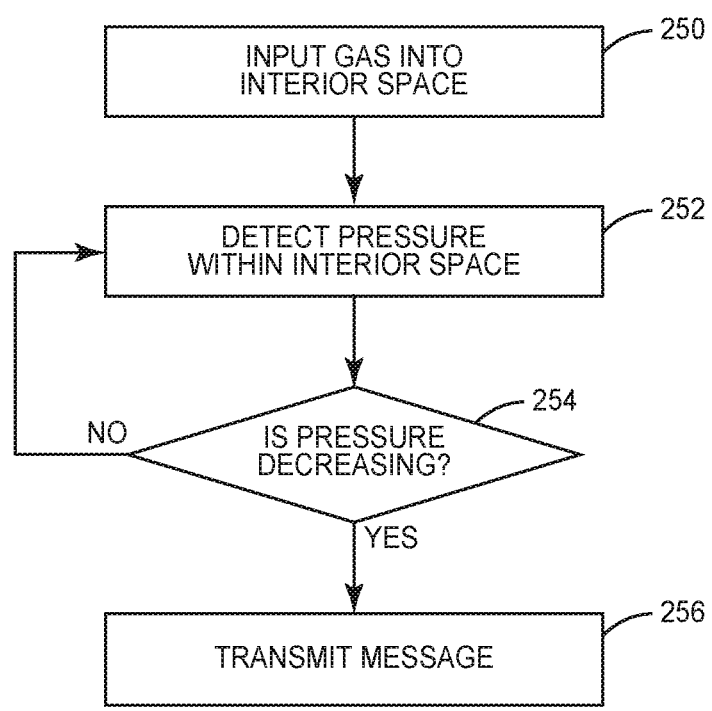
FIG. 12 is a flowchart diagram of a method of pressurizing a first shell and detecting for leaks.

As illustrated in FIG. 11, the watercraft 10 further includes a control unit 202. The control unit 202 is connected through the cables that extend from the processing circuitry 110 as illustrated in FIG. 10. The control unit 202 can be mounted to the platform 201 of the watercraft 10 (see FIG. 2), or can be mounted to one or both of the first and second shells 20, 30. The control unit 202 includes electronics such as navigation/position circuits, networking circuits, and the like, a battery pack, and other control equipment, as required or desired for particular applications.

As illustrated in FIGS. 10 and 11, an AMPS power domain can be included in the processing circuitry 110 and the control unit 202. This unique power domain functions with the watercraft 10 because the WiSL (Wideband Streaming L-band) satellite communication terminal is powered by outlet power.

Electrical circuitry in the satellite communication circuitry 100, radome 101, processing circuitry 110, and/or control unit 202 is connected by connectors 40, to effect the transfer of communication signals, control signals and commands, data, and the like, as well as for the distribution of electrical power. The connectors 40 can include various cables, including a type G expansion cable. The connectors 40 can be marine rated. Further, the ports 55 of the first shell 20 and ports 34 of the second shell 30 and the interfaces at the ports 55, 34 are marine rated. The various connectors 40 are sized according to the voltage and maximum current anticipated, as well known in the art.

The first and second shells 20, 30 form the sealed interior spaces 23, 33 that house the satellite communication circuitry 100 and the processing circuitry 110 respectively. The first and second shells 20, 30 are IP-68 rated to prevent the ingress of water if submersed in up to thirty (30) meters of water for half an hour. This waterproofing rating provides for the protection of the satellite communication circuitry 100 and the processing circuitry 110 in the various harsh environments in which the watercraft 10 can be used. Other designs can include one or both of the first and second shells 20, 30 having a lower waterproofing rating.

The first shell 20 is configured to be pressurized to provide for detecting a leak. FIG. 11 illustrates a method of pressurizing and detecting for the leak. This can include initially inputting gas into the pressure port 56 and increasing a pressure of the interior space 23 above an ambient pressure (block 250). The extent that the pressure is raised can vary depending upon the context of use. The insertion of the gas includes inserting a nozzle into the opening 80 of the pressure port 56 and through the seal 81 that extends across the opening 80. Once inserted, gas is expelled from the nozzle into the interior space 23. Once completed, the nozzle is removed from the opening 80 and the seal 81 extends across the opening 80 to prevent leakage. The first shell 20 can be pressurized prior to or after being mounted to the deck of the watercraft 10.

The one or more pressure sensors 102 within the interior space 23 detect the pressure (block 252). Signals from the one or more pressure sensors 102 can be transmitted to processing circuitry in one or more of the satellite communication circuitry 100, processing circuitry 110, and control unit 202. The pressure within the interior space is monitored to determine if the pressure is decreasing (block 254). If the pressure remains the same or above a predetermined threshold, the monitoring continues. If the pressure drops a predetermined amount or below a predetermined threshold, a message can be sent to a remote source indicating the leak (block 256).

Detection of a leak can result in the watercraft 10 being recovered by monitoring personnel. In addition to signaling that a leak has occurred, the signaling can also include the extent of the leak. A relatively small leak may still provide for the first shell 20 to adequately protect the satellite communication circuitry 100 for a period of time. A relatively larger leak may require immediate attention or attention in a shorter period of time.

Figure 13:
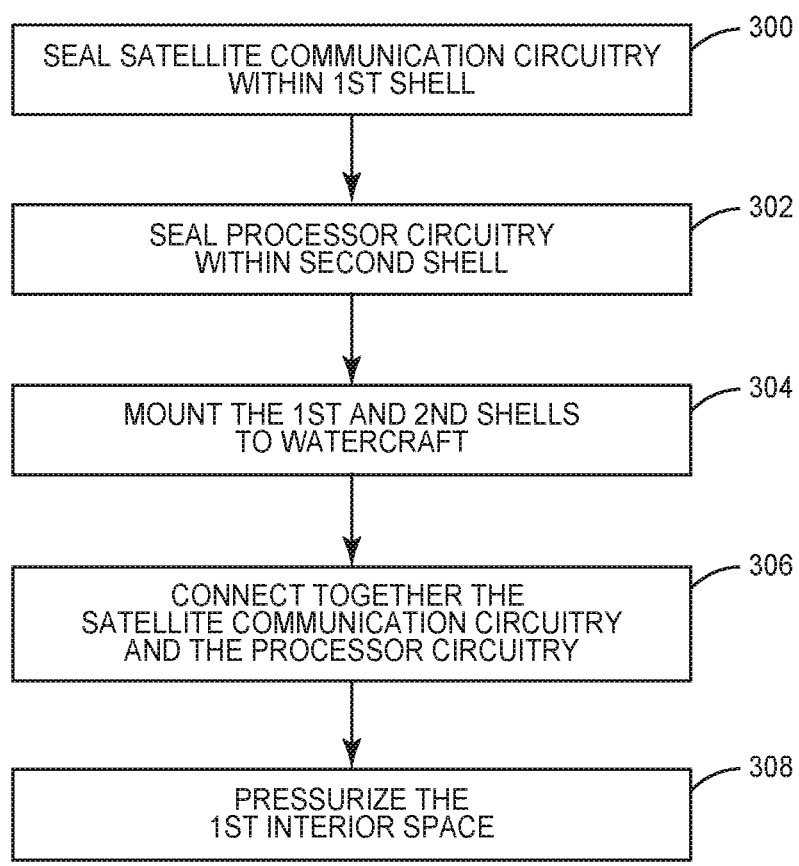
FIG. 13 is a flowchart diagram of a method of protecting satellite communication circuitry and processing circuitry for use on an autonomous watercraft.

FIG. 13 illustrates a method of protecting satellite communication circuitry 100 and processing circuitry 110 for use on an autonomous watercraft 10. The method includes sealing the satellite communication circuitry within a waterproof first interior space 23 of a first shell 20 that is formed between a first base 21 and a first lid 22 (block 300). The processing circuitry 110 is sealed within a waterproof second interior space 33 of a second shell 30 that is formed between a second base 31 and a second lid 32 (block 302). The first and second shells 20, 30 are mounted to the watercraft 10 (block 304). One or both of the first and second shells 20, 30 can be mounted to the watercraft 10 prior to or after the satellite communication circuitry 100 and the processing circuitry 110 and sealed within the first and second interior spaces 23, 33. This can include mounting the bases 21, 31 to the watercraft 10, positioning the satellite communication circuitry 100 and the processing circuitry 110 in the first and second interior spaces 23, 33, and then sealing the interior spaces 23, 33 by attaching the lids 22, 32.

The method also includes connecting together the satellite communication circuitry 100 and the processing circuitry 110 (block 306). This can include connecting one or more connectors 40 to the ports 55, 34 of the first and second shells 20, 30. One or more of the connections can also be wireless.

The method includes inserting a gas into the first interior space 23 through the pressure port 56 and pressurizing the first interior space 23 (block 308). Additionally or alternatively, the second interior space 33 can be pressurized in a similar manner. This includes inserting a gas through a pressure port in the second shell 30 and detecting the pressure with one or more pressure sensors 102 within the second interior space 33.

The waterproof container system 19 can be constructed from various materials, including but not limited to plastic and metals. The first shell 20 and the second shell 30 can be constructed from the same or different materials. In one design, the base 21 and lid 22 of the first shell 20 are constructed from aluminum and the base 31 and lid 32 of the second shell 30 are constructed from plastic.

The present application discloses the waterproof container system 19 for use with an autonomous watercraft 10. The waterproof container system 19 can also be used on a variety of other vehicles, such as, without limitation, manned watercraft, manned and unmanned aircraft, manned and unmanned rotorcraft, manned and unmanned surface and sub-surface water-borne vehicles, and a variety of objects and structures.

Figure 14:
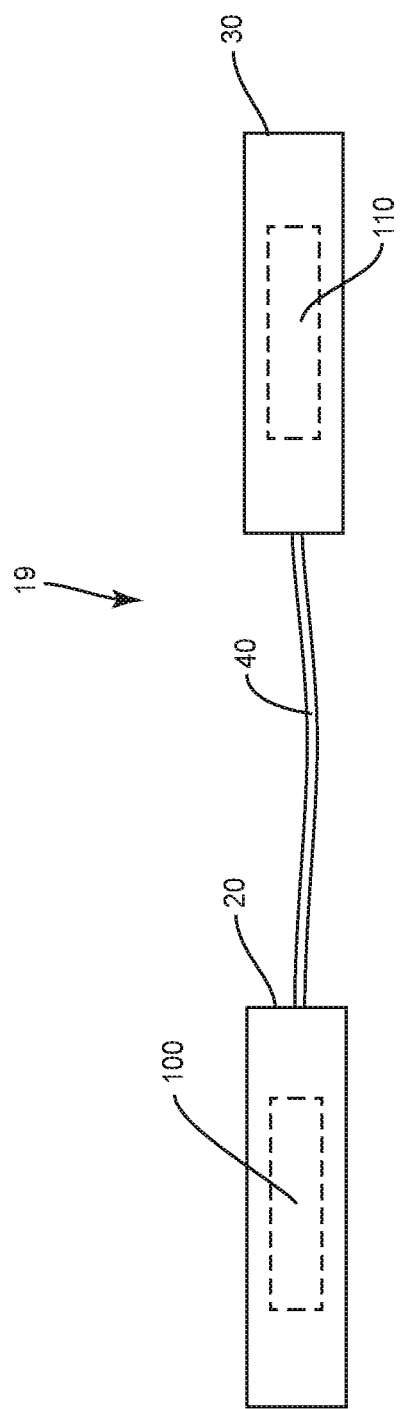
FIG. 14 is a schematic diagram of a waterproof container system that houses first and second circuitry.

The disclosure above includes an embodiment with the waterproof container system 19 used with a watercraft 10. The waterproof container system 19 can also be used in other contexts that do not include a watercraft 10. FIG. 14 illustrates a waterproof container system 19 that includes a first shell 20 and a second shell 30. First circuitry 100 can be housed in the first shell 20 and second circuitry 110 can be housed in the second shell 30. The first and second shells 20, 30 can be configured to provide for communications and/or power to be shared between the first and second circuitry 100, 110. This can include one or more connectors 40.

The disclosure above also includes an embodiment with the waterproof container system 19 that houses a satellite communication terminal with the first circuitry 100 being satellite communication circuitry and the second circuitry 110 being processing circuitry. The waterproof container system 19 can be used to house a wide variety of other electrical components with a wide of electrical circuitry.

The watercraft 10 described above includes a pressure port 56 and one or more pressure sensors 102 associated with the first shell 20. The second shell 30 can also include a pressure port 56 and one or more pressure sensors 102 to provide for leak detection. Other embodiments can include no pressure ports 56 or pressure sensors 102 associated with either of the first and second shells 20, 30.

FIG. 10 includes a router 111 in the second interior space 23. Other embodiments can include no router 111.

While the preferred variations and alternatives of the present disclosure have been illustrated and described, it will be appreciated that various changes and substitutions can be made therein without departing from the spirit and scope of the disclosure. Accordingly, the scope of the disclosure should only be limited by the accompanying claims and equivalents thereof. When introducing elements of the present disclosure or exemplary aspects or embodiment(s) thereof, the articles "a," "an," "the" and "said" are intended to mean that there are one or more of the elements. The terms "comprising," "including" and "having" are intended to be inclusive and mean that there may be additional elements other than the listed elements. Although this disclosure has been described with respect to specific embodiments, the details of these embodiments are not to be construed as limitations. While the preferred variations and alternatives of the present disclosure have been illustrated and described, it will be appreciated that various changes and substitutions can be made therein without departing from the spirit and scope of the disclosure.

The present invention may be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

The invention claimed is:

1. A watercraft comprising:
   first circuitry and a second circuitry;
   a first shell mounted on a deck of the watercraft, the first shell comprising a sealed first interior space that contains the first circuitry;
   a second shell mounted under the deck of the watercraft, the second shell comprising a sealed second interior space sized to contain the second circuitry;
   first ports that extend through each of the first and second shells;

a pressure port that extends through the first shell and is in communication with the first interior space, the pressure port comprising an opening and a seal that extends across the opening to prevent ingress of water into the first interior space and egress of gas out of the first interior space;

a first heat sink positioned in the first interior space to contact against the first circuitry; and a second heat sink positioned in the second interior space to contact against the second circuitry.

2. The watercraft of claim 1, wherein the first circuitry is satellite communication circuitry and the second circuitry is processing circuitry.

3. The watercraft of claim 1, wherein each of the first and second shells comprise a waterproof rating of IP-68 to protect the first circuitry and the second circuitry.

4. The watercraft of claim 1, wherein the pressure port is positioned away from the first ports on the first shell.

5. The watercraft of claim 1, wherein each of the first and second shells comprise a base and a lid that are sealed together to form the sealed first and second interior spaces, the base of the first shell mounted on the deck of the watercraft and the base of the second shell mounted in an interior space of the watercraft.

6. The watercraft of claim 1, further comprising communication and power cables that connect to the first ports of the first and second shells to integrate the first circuitry and the second circuitry.

7. The watercraft of claim 1, further comprising a first opening in the second shell with the second heat sink extending across the first opening and being exposed on an exterior of the second shell.

8. The watercraft of claim 2, further comprising an opening in the first shell positioned away from the deck of the watercraft, the opening sized to receive a radome of the satellite communication circuitry that extends outward away from the deck of the watercraft.

9. The watercraft of claim 1, further comprising a pressure sensor positioned within the first interior space to detect a pressure within the first interior space.

10. The watercraft of claim 1, further comprising a router positioned within the second interior space.

11. A watercraft comprising:

first circuitry positioned on the watercraft;

second circuitry positioned on the watercraft away from the first circuitry and in communication with the first circuitry;

a waterproof first shell mounted to the watercraft and that contains the first circuitry, the first shell comprising:

a first base and a first lid that are connected together to form a sealed first interior space sized to contain the first circuitry;

first ports that extend through the first shell and are in communication with the first interior space;

a pressure port mounted away from the first ports, the pressure port extending through the first shell and in communication with the first interior space and comprising a seal that extends across the pressure port to prevent ingress of water into the first interior space and egress of pressurized gas out of the first interior space; and a first heat sink connected to the first shell and positioned in the first interior space against the first circuitry;

a waterproof second shell mounted to the watercraft away from the first shell and that contains the second circuitry, the second shell comprising:

a second base and a second lid that are connected together to form a sealed second interior space sized to contain the second circuitry;

second ports that extend through the second shell and are in communication with the second interior space; and a second heat sink positioned in the second interior space to contact against the second circuitry.

12. The watercraft of claim 11, wherein each of the first and second shells comprises a waterproof rating of IP-68 to protect the first circuitry and the second circuitry.

13. The watercraft of claim 11, further comprising:

RF cables that extends between first pairs of the first and second ports on the first and second shells to communicatively connect the first circuitry and the second circuitry;

a type G expansion cable that extends between second pairs of first and second ports on the first and second shells.

14. The watercraft of claim 11, further comprising an opening in the second shell with the second heat sink extending across the opening and being exposed on an exterior of the second shell.

15. The watercraft of claim 14, wherein the second heat sink is connected to the second shell and sealed against the second shell to prevent ingress of water through the opening and into the second interior space.

16. The watercraft of claim 11, further comprising a pressure sensor positioned within the first interior space to detect a pressure of the gas in the first interior space.

17. The watercraft of claim 11, further comprising a router positioned within the second interior space.

18. A waterproof container system configured to protect first circuitry and second circuitry, the waterproof container system comprising:

a waterproof first shell that contains the first circuitry, the first shell comprising:

a first base and a first lid configured to be connected together to form a sealed first interior space sized to contain the first circuitry;

first ports that extend through the first shell and are in communication with the first interior space;

a pressure port mounted away from the first ports, the pressure port extending through the first shell and in communication with the first interior space and comprising a seal that extends across the pressure port to prevent ingress of water into the first interior space and egress of pressurized gas out of the first interior space; and a first heat sink connected to the first shell and positioned in the first interior space to contact against the first circuitry;

a waterproof second shell separate from the first shell and that contains the second circuitry, the second shell comprising:

a second base and a second lid configured to be connected together to form a sealed second interior space sized to contain the second circuitry;

second ports that extend through the second shell and are in communication with the second interior space; and a second heat sink positioned in the second interior space to contact against the second circuitry.

19. The container system of claim 18, wherein the first shell is sized to contain the first circuitry that is satellite communication circuitry and the second shell is sized to contain the second circuitry that is processing circuitry.

20. The container system of claim 18, wherein each of the first and second shells has a waterproof rating of IP-68 to protect the first circuitry and the second circuitry.

* * * * *